United States Patent [19]
Varadarajan et al.

[11] Patent Number: 5,963,060
[45] Date of Patent: Oct. 5, 1999

[54] LATCHING SENSE AMPLIFIER

[75] Inventors: Hemmige D. Varadarajan, Hillsboro, Oreg.; Jeffrey K. Greason, Tehaohapi, Calif.

[73] Assignee: Intel Corporation, Santa Clara, Calif.

[21] Appl. No.: 08/946,286

[22] Filed: Oct. 7, 1997

[51] Int. Cl.[6] .................................................. G11C 7/06
[52] U.S. Cl. .............................................. 327/55; 327/57
[58] Field of Search .................................. 327/52, 54, 55, 327/56, 57

[56] References Cited

U.S. PATENT DOCUMENTS

| | | | |
|---|---|---|---|
| 4,843,264 | 6/1989 | Galbraith | 327/55 |
| 4,973,864 | 11/1990 | Nogami | 327/55 |
| 5,132,574 | 7/1992 | Yumoto | 327/55 |
| 5,729,159 | 3/1998 | Gersbach | 327/52 |
| 5,796,273 | 8/1998 | Jung et al. | 327/55 |

*Primary Examiner*—Toan Tran
*Attorney, Agent, or Firm*—Howard A. Skaist

[57] ABSTRACT

Briefly, in accordance with one embodiment of the invention, an integrated circuit includes: a latching sense amp circuit. The latching sense amp circuit is configured in the integrated circuit so that the signals to produce and latch an output signal consist essentially of a precharge pulse and a capture pulse.

18 Claims, 3 Drawing Sheets

LATCHING SENSE AMPLIFIER

BACKGROUND OF THE INVENTION

1. Field of the Invention

The present invention relates to latch circuits, and, more particularly, to a latching dynamic sense amplifier circuit ("latching sense amp" hereinafter).

2. Background Information

Latching sense amp circuits are used in a variety of situations. For example, such a circuit may be useful as an input buffer, such as an input buffer for a signal provided to or by a memory, such as a static random access memory cell (SRAM) or dynamic random access memory (DRAM), for example. Such circuits are desirable because the signal provided is amplified and then stored as a binary digital signal or bit, which may then be processed.

Of course, such circuits may be employed in a variety of other situations as well. Conventional latching dynamic sense amp circuits, however, have a variety of disadvantages. For example, by drawing current from the input pins, such circuits may degrade performance by affecting the input signal, such as provided from a memory. In addition, typically such circuits employ three pulses for operation, a precharge pulse, a sample pulse, and a capture pulse. In contrast with memory applications, successfully coordinating these three pulses in a single cycle may be inconvenient for chip-to-chip communications, particularly in an environment in which it is not known in advance when the signal will be transferred. A third disadvantage of such conventional circuits is the application of three pulses for circuit operation. Typically, these three pulses may employ on the order of 900 pico-seconds of time. However, if signals being applied arrive with a relatively high data rate, this amount of time may be a disadvantage. Such conventional latching sense amps may also not be desirable for use in connection with relatively noisy signals because voltage spikes above the positive supply voltage or below the negative supply voltage may degrade performance where the sampling mechanism is implemented by a transmission gate. A need, therefore, exists for a latching sense amp that overcomes or reduces the foregoing disadvantages.

SUMMARY OF THE INVENTION

Briefly, in accordance with one embodiment of the invention, an integrated circuit includes: a latching sense amp circuit. The latching sense amp circuit is configured in the integrated circuit so that the signals to produce and latch an output signal consisting essentially of a precharge pulse and a capture pulse.

BRIEF DESCRIPTION OF THE DRAWINGS

The subject matter regarded as the invention is particularly pointed out and distinctly claimed in the concluding portions of the specification. The invention, however, both as to organization and method of operation, together with objects, features and advantages thereof, may best be understood by reference to the following detailed description when read with the accompanying drawings in which:

DETAILED DESCRIPTION OF THE INVENTION

In the following detailed description, specific details are set forth in order to provide a thorough understanding of the invention. However, it will be understood by those skilled in the relevant art that the present invention may be practiced without these specific details. For example, the invention is not limited in scope to particular voltage levels, particular types of transistors or to particular conventions regarding the designation of high and low signals. In other instances, well-known methods, procedures, components, and circuits have not been described in detail so as not to obscure the present invention.

Figure 2:
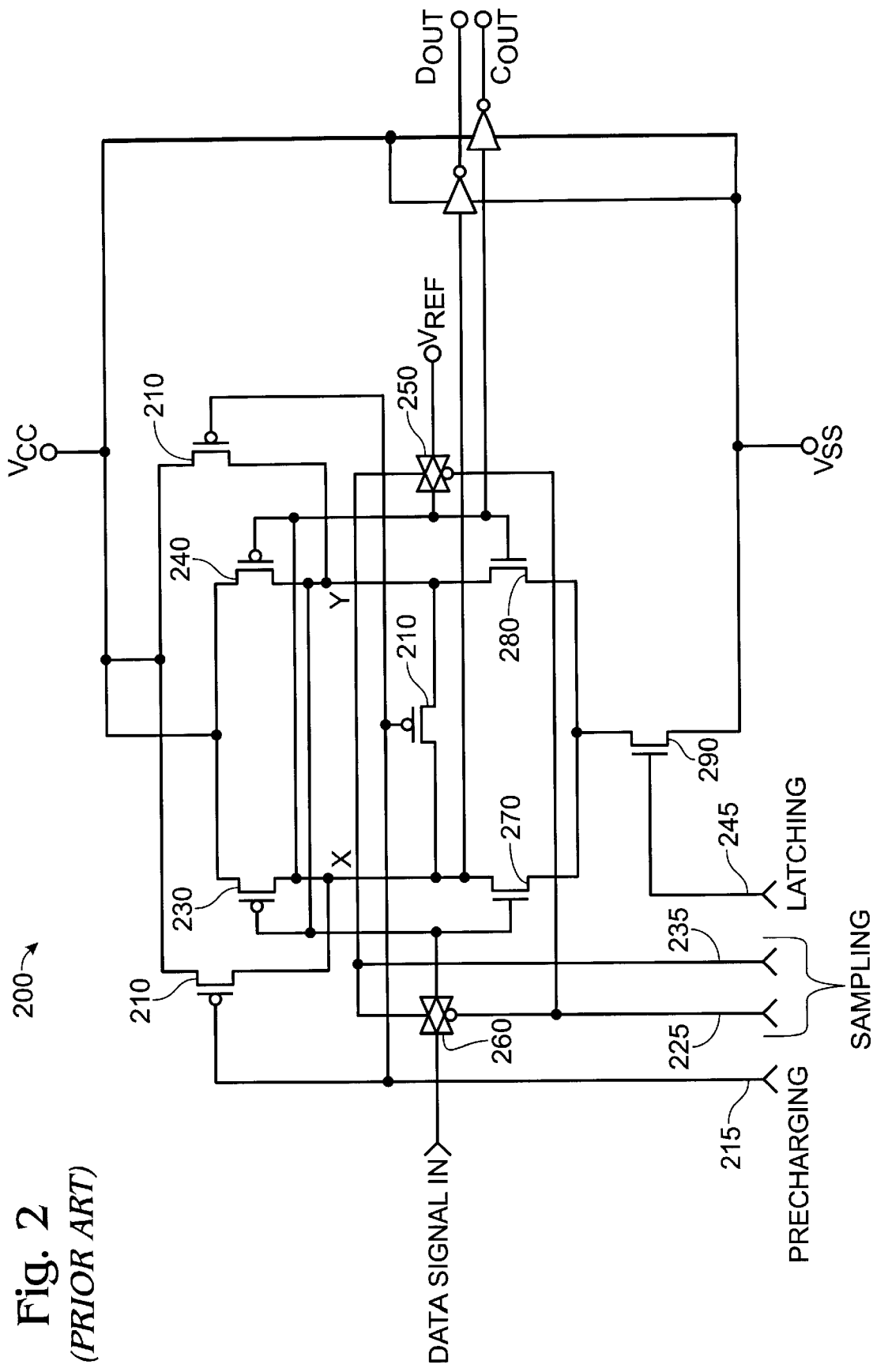
FIG. 2 is a circuit diagram illustrating an embodiment of a conventional latching sense amp circuit.

FIG. 2 is an embodiment of a latching sense amplifier circuit ("latching sense amp" or "latching sense amp circuit", hereinafter). In FIG. 2, transistors 210 perform a precharge operation, as shall be discussed in greater detail hereinafter. As illustrated, an input voltage signal is applied via transmission gate 260. Likewise, a reference voltage signal is applied via transmission gate 250. As illustrated, these gates include portions that respond to true and complementary signals, respectively. First, the internal nodes are precharged to the supply voltage level, such as $V_{cc}$. Precharge is accomplished by applying an inverted pulse (high, low, high) signal to transistors 210, these transistors controlling the precharging for transistors 230, 240, 270 and 280. After internal nodes X and Y are sufficiently precharged, the input signal is sampled. This is accomplished via transmission gates 250 and 260. In order to sample the input signal, a positive (low, high, low) pulse is applied to the NMOS transmission gate that responds to a non-inverted pulse and an inverted (high, low, high) pulse is applied to the PMOS transmission gate that responds to such a pulse.

While sampling, pass or transmission gates 250 and 260 are turned on. The applied input and reference voltage signals are present on nodes X and Y indicated on FIG. 2. The latching sense amp enable transistor 290 is then turned on by applying a high signal at node 245 and immediately afterwards the sampling pass gates 250 and 260 are turned off.

Nodes X and Y then begin to discharge through transistors 270, 280 and 290. Whichever of nodes X and Y is lower in voltage will discharge more rapidly because it has a relatively higher gate-to-source voltage applied to its discharge transistor. For example, if node X is at a higher voltage than node Y, transistor 270 has the higher gate-to-source voltage than transistor 280. Hence, node Y will discharge more rapidly. As a result, the initial difference in voltage between nodes X and Y is, therefore, amplified.

Once the lower voltage of node X and node Y reaches the appropriate voltage level, the corresponding PMOS device, in this embodiment one of transistors 230 and 240, will turn on, pulling the higher voltage of nodes X and Y in this embodiment towards the supply voltage, $V_{cc}$. This provides additional amplification. In a relatively short time, such as typically below 200 pico-seconds, nearly full rail amplification may be achieved. This value is then retained or "latched" with transistor 290 on. Complementary output signals are likewise available since nodes X and Y are the inverse of each other after the previously described sensing operation has occurred.

Latching sense amp circuits are used in a variety of situations. For example, such a circuit may be useful as an input buffer, such as an input buffer for a signal provided by a memory. Such circuits are desirable because the signal provided by the memory is amplified and then stored as a binary digital signal, which may then be processed. Of course, such circuits may be employed in a variety of other situations as well.

Conventional latching sense amp circuits, however, have a variety of disadvantages, as previously indicated. For example, during the short time pass gates 250 and 260 are on at the same time as transistor 290, such circuits may degrade performance by affecting the input signal. In addition, typically, such circuits employ three pulses for operation, a precharge pulse, a sample pulse, and a capture or latching pulse. Successfully coordinating these three pulses may be inconvenient for chip-to-chip communications, particularly in an environment in which it is not known in advance when the signal will be applied. A third disadvantage of such conventional circuits is the application of three pulses for circuit operation. Typically, these three pulses may employ on the order of 900 pico-seconds of time. However, if signals being applied arrive with a relatively high data rate, this time to complete the three pulses may be a disadvantage. Likewise, such conventional latching sense amp circuits are not desirable for use in connection with relatively noisy signals because voltage spikes occurring at voltages outside the range of the supply voltages may degrade performance due to the effect on the transmission gates.

Figure 1:
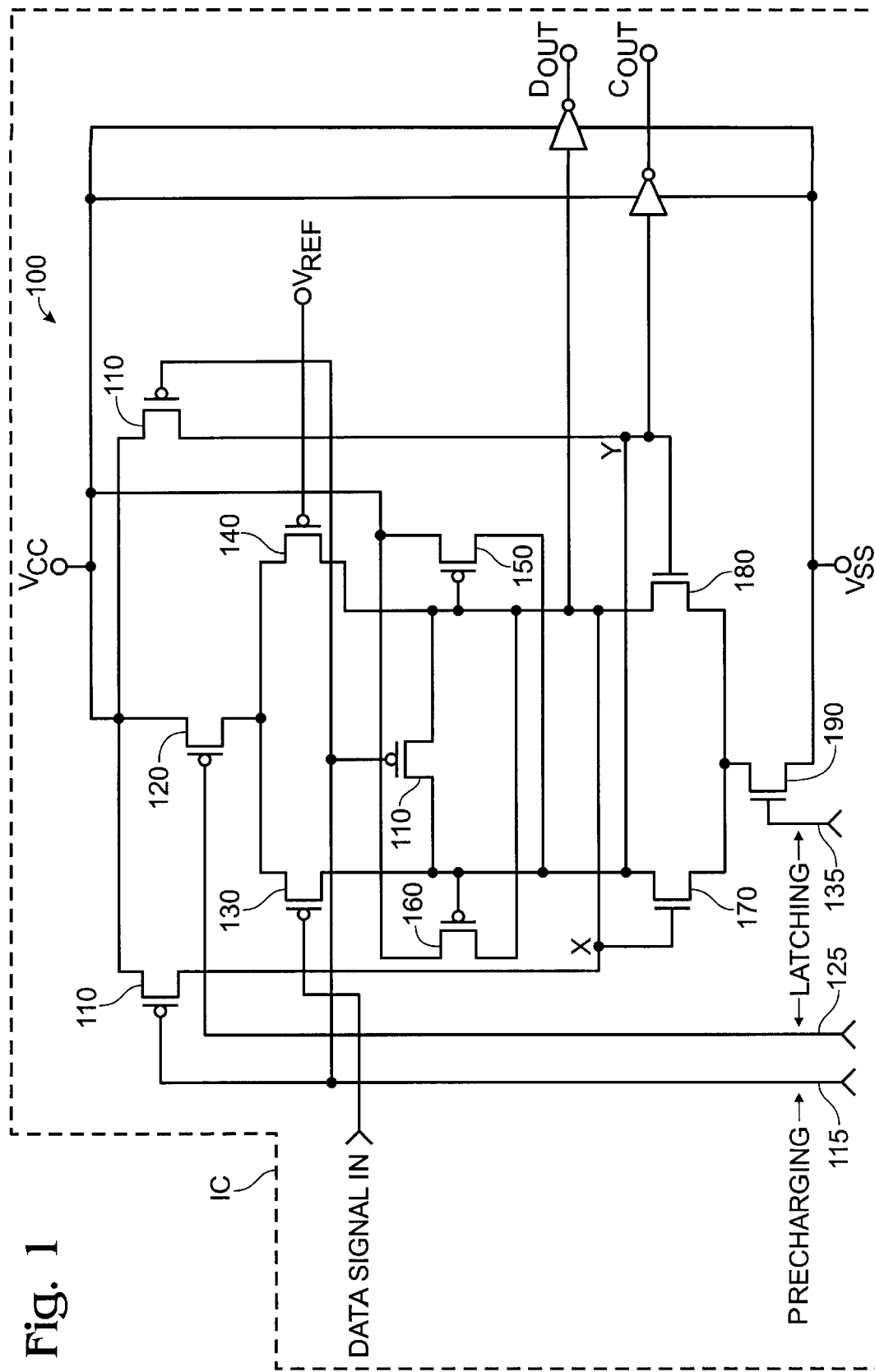
FIG. 1 is a circuit diagram illustrating one embodiment of a latching sense amp circuit in accordance with the invention.

FIG. 1 is a circuit diagram illustrating an embodiment 100 of a latching sense amp in accordance with the present invention. Embodiment 100 is illustrated as part of an integrated circuit (IC), although the invention is not limited in scope in this respect. This particular embodiment illustrates several differences with respect to the circuit illustrated in FIG. 2. In this particular circuit, transistors 150 and 160 may be small relative to transistors 230 and 240 of FIG. 2. Likewise, transmission gates 250 and 260 are omitted. In addition, transistors 130, 140 and 120 may be larger than transistors 230 and 240 of FIG. 2. Furthermore, input voltage and reference voltage signals are applied to transistors 130 and 140; however, in contrast with the circuit illustrated in FIG. 2 in which these signals are applied to transistors 270 and 280, the signals are not applied to transistors 170 and 180. Whereas a capture pulse is applied to transistor 290 in FIG. 2, another difference is that for the embodiment illustrated in FIG. 1, capture pulses are applied to transistors 20 and 190. As shall be discussed in greater detail hereinafter, the order of the precharge and capture pulses are also reversed for the circuit illustrated in FIG. 1 and the sample pulse is omitted.

This embodiment of a latching sense amp circuit in accordance with the invention provides a number of advantages over the circuit illustrated in FIG. 2. In addition to the reduction in the number of transistors due to the omission of the transmission gates, this particular circuit also reduces direct current (DC) loading by the circuit of the input voltage signal. This reduces the risk of disturbing the signal source, which might cause an undesirable reflection or signal loss, for example. Furthermore, by omitting the transmission gates, a sample pulse is omitted from operation and, therefore, the time employed for latching to occur is reduced. For example, simulations of the embodiment illustrated in FIG. 1 indicate that data capture may be accomplished in less than on the order of 500 pico-seconds, which is almost a 50% reduction from the typical amount of time employed. Time is also saved by inverting the order of precharging and capture pulses, as shall be explained.

As previously described, for operation, the circuit illustrated in FIG. 2 employs a sequence of a pre-charging pulse, a sampling pulse and then a capture or latching pulse. For example, referring to FIG. 2, an inverted pulse may be applied to transistors 210. The drains of transistors 230 and 240 are, therefore, charged to $V_{cc}$. Next, sample pulses are applied to transmission gates 250 and 260. As a result of the transmission gates being opened or conducting, a signal to be amplified and latched is applied to the sense amp. The input and reference voltage signals are present on nodes X and Y. Transistor 290 is then turned on and immediately afterwards transmission gates 250 and 260 are turned off. Nodes X and Y begin to discharge. One of the two nodes will discharge more rapidly and, as a result, the difference in voltage between nodes X and Y is amplified. Furthermore, once the lower of nodes X and Y reaches a threshold voltage, one of transistors 230 and 240 will be turned on, pulling the higher voltage of the two nodes towards the supply voltage and providing additional amplification. Furthermore, this value is "latched," with transistor 290 on.

Embodiment 100 of a latching sense amp in accordance with the present invention, illustrated in FIG. 1, operates differently in several respects than the circuit illustrated in FIG. 2, as is clear from a comparison of FIGS. 1 and 2 and by the following discussion. As illustrated, transmission gates 250 and 260 are omitted. Likewise, input voltage and reference voltage signals are applied to transistors 130 and 140, but not to transistors 170 and 180, in this particular embodiment. In contrast, the input voltage signal and reference voltage signal are applied to all four transistors in the circuit configuration of FIG. 2. Furthermore, the latching sense amp is configured so that signals applied to produce and latch an output signal from a voltage signal consist essentially of a precharge pulse and a capture pulse. In addition, transistors 170 and 180 are cross-coupled, drain-to-gate. In contrast, in FIG. 2, transistors 230 and 240 are cross-coupled, drain-to-gate. This cross coupling of transistors 170 and 180 in FIG. 1 forms a regenerative feedback loop. In this embodiment, therefore, the regenerative loop portion or stage of the circuit, including transistors 170 and 180, serves as a load for the differential amplifier portion or stage, including transistors 130 and 140. One advantage is that it decouples the regenerative loop from the applied input and reference voltage signals, including during application of the capture pulse. When the input voltage signalsand reference voltage signal are applied to transistors 130 and 140 and the difference in applied voltage results in one side of the sense amp conducting more than the other side, due to the cross-coupling of 170 and 180, this behavior is reinforced and, thus, results in either transistors 130 and 180 or 140 and 170 conducting when a capture signal is applied to transistors 120 and 190. Transistor 120 is turned on only as long as needed to latch the signal to further decouple or isolate the signal source. Nonetheless, this does not result in additional delay in latching the signal, in contrast with the circuit of FIG. 2, in which the transmission gates are turned off immediately after the capture pulse is applied, as previously described.

It is desirable to keep the time from the "trigger event", such as the time the data input voltage signal is applied to the circuit configuration, to the capture or latching of the applied signal, relatively short. Reducing this time reduces signal variations attributable to IC processing, voltage, and temperature variations, for example. For the circuit embodiment illustrated in FIG. 1, reducing this time may be accomplished by reversing the order of the precharge and capture pulses. For the embodiment illustrated in FIG. 2, once the input voltage signal is applied, the sense amp is precharged, the transmission gates are opened, the sense amp becomes activated, the transmission gates are closed, and then the sense amp output signal is latched. In contrast, for the FIG. 1 embodiment, before the application of the input voltage signal, the sense amp has already been precharged. Therefore, once the input voltage signal is applied, the sense amp is activated and transistor 120 is turned off. Then, the sense amp output signal is latched. Thus, the time between the trigger and the production of an output signal occurs is reduced.

One risk for the technique employed by the embodiment illustrated in FIG. 1 is that there may be a long delay between trigger events. As a result, latching sense amp internal nodes X and Y may not hold the state of the latch. In this embodiment, weak current sources in the form of transistors 150 and 160, coupled to operate as current sources, are included to sustain the state of the latch for cases where long delay times between data capture events occur, although the invention is not limited in scope in this respect. Likewise, because these transistors provide only a relatively small amount of current, the size of transistors 150 and 160 may be small relative to, for example, transistors 230 and 240. Likewise, transistors 120, 130 and 140 are large relative to transistors 230 and 240, so that these transistors may accomplish approximately the gain previously accomplished by transistors 230, 240, 270 and 280 in FIG. 2. Of course, again, the invention is not limited in scope in these respects.

Figure 3:
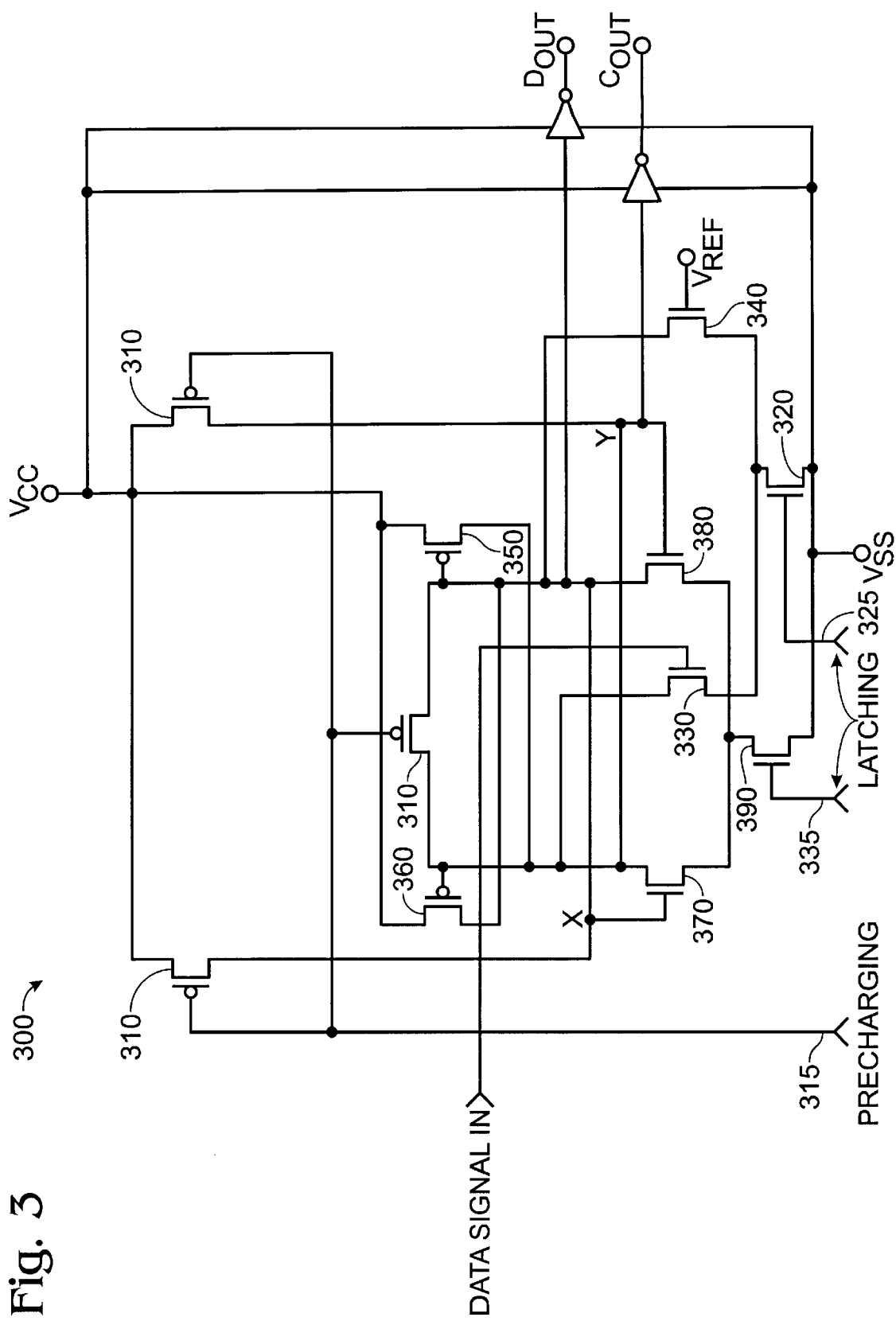
FIG. 3 is a circuit diagram illustrating another embodiment of a latching sense amp circuit in accordance with the invention.

FIG. 3 is a circuit diagram illustrating another embodiment, 300, of a latching sense amplifier circuit in accordance with the present invention. The operation of this particular embodiment is similar to the operation previously described with respect to the embodiment illustrated in FIG. 1. A difference between this embodiment and the embodiment of FIG. 1, however, is a replacement of positive metal-oxide semiconductor (PMOS) transistors 120, 130 and 140 of FIG. 1 with negative metal-oxide semiconductor (NMOS) transistors 320, 330 and 340 in the embodiment illustrated in FIG. 3. Otherwise, the circuits are substantially similar. One advantage of this particular embodiment is that by using NMOS transistors in place of PMOS transistors, operation should be faster because electrons are typically faster than holes in MOS transistors. Another advantage of this particular embodiment is that the data dependent charge applied to the internal nodes of the circuit now occurs on the lower voltage side, $V_{ss}$ rather than higher voltage side $V_{cc}$. This may provide an advantage in comparison with the operation of the embodiment illustrated in FIG. 1, in which one of the P devices operates to raise the voltage level of one of the nodes. Furthermore, in another alternative embodiment, the gates of transistors 350 and 360 may be directly coupled to $V_{ss}$, for example.

An embodiment of a method of amplifying and latching an input voltage signal in accordance with the invention may be accomplished as follows. The voltage signal may be amplified and latched by an embodiment of a latching sense amp circuit in accordance with the invention that includes an differential amplifier stage coupled to a regenerative feedback loop stage, such as the embodiments illustrated in FIGS. 1 and 3.

A precharge signal may be applied so that internal nodes of the latching sense amp circuit, such as nodes X and Y in FIG. 1, are precharged to an appropriate voltage level. An input voltage and reference voltage signal are applied to two input transistors of the differential amplifier stage. Capture pulses are applied to two other transistors, respectively coupling the differential amplifier and regenerative feedback loop stages to respective voltage sources, such as $V_{cc}$ and $V_{ss}$, as illustrated in FIG. 1, for example, by transistors 120 and 190. However, the capture pulse applied to the transistor, such as 120, coupling the differential amplifier stage to a voltage source, such as $V_{cc}$, is removed, while the capture pulse applied to the transistor, such as 190, coupling the regenerative feedback loop stage to a voltage source, such as $V_{ss}$, continues to be applied. As previously described, removing one of the capture pulses reduces the possibility of disturbing the applied input voltage signals. Of course, the invention is not limited in scope to this embodiment.

While certain features of the invention have been illustrated as described herein, many modifications, substitutions, changes and equivalents will now occur to those skilled in the art. For example, instead of applying an input and reference voltage signal, input differential voltage signals may be applied in an embodiment in accordance with the invention. It is, therefore, to be understood that the appended claims are intended to cover all such modifications and changes as fall within the true spirit of the invention.

We claim:

1. An integrated circuit comprising: a latching sense amp circuit; said latching sense amp circuit being coupled so that signals applied to produce and latch an output signal from at least an input signal source consist essentially of a precharge pulse and a capture pulse, a voltage signal source being decoupled from said latching sense amp circuit during application of the capture pulse to said latching sense amp circuit.

2. An integrated circuit of claim 1, wherein said latching sense amp circuit is further coupled so that the at least an input voltage signal source is capable of being decoupled from said latching sense amp circuit during application of the capture pulse without introducing additional delay to latch the output signal of said latching sense amp circuit.

3. The integrated circuit of claim 2, wherein said latching sense amp circuit includes cross-coupled transistors, said latching sense amp circuit being coupled so that the application of the at least an input voltage signal produces a regenerative feedback loop during latching sense amp circuit operation due to said cross-coupled transistors.

4. The integrated circuit of claim 3, wherein said cross-coupled transistors are included in a regenerative feedback loop stage of said latching sense amp circuit; said latching sense amp circuit further including a differential amplifier stage coupled to said regenerative feedback loop stage; said latching sense amp circuit being configured so that the at least an input voltage signal is applied to input transistors in said differential amplifier stage.

5. The integrated circuit of claim 4, wherein said latching sense amp circuit includes additional transistors coupled to precharge said input and said cross-coupled transistors.

6. The integrated circuit of claim 4, said latching sense amp circuit includes transistors adapted to respectively couple said regenerative feedback loop stage and said differential amplifier stage to voltage sources.

7. The integrated circuit of claim 6, and further comprising transistor-coupled current sources to sustain the state of said latching sense amp circuit after latching the output signal.

8. The integrated circuit of claim 3, wherein the at least an input voltage signal includes an input and a reference voltage signal.

9. A latching sense amplifier circuit comprising:
a differential amplifier stage;
a regenerative feedback loop state;
said stages being coupled so that a voltage signal source is decoupled from said latching sense amplifier circuit during application of a capture pulse to said latching sense amplifier circuit; and wherein said stages are further coupled so that signals applied to produce and latch an output signal consist essentially of a precharge pulse and a capture pulse.

10. The latching sense amplifier circuit of claim 9, wherein said regenerative feedback loop stage includes cross-coupled transistors.

11. The latching sense amplifier of claim 10, wherein said cross-coupled transistors comprise cross-coupled negative metal-oxide semiconductor (NMOS) transistors.

12. The latching sense amplifier circuit of claim 11, wherein said differential amplifier stage comprises input transistors, said input transistors comprise one of positive metal-oxide semi-conductor (PMOS) and NMOS transistors.

13. The latching sense amplifier of claim 9, wherein the voltage signal comprises an input and a reference voltage signal.

14. A method of amplifying and latching a voltage signal using a latching sense amplifier circuit including a differential amplifier stage coupled to a regenerative feedback loop stage, said method comprising:

applying signals to produce and latch an output signal from the voltage signal, said applied signals consisting essentially of a precharge pulse and a capture pulse; and decoupling the voltage signal source from said latching sense amplifier circuit during application of the capture pulse.

15. The method of claim 14, wherein the voltage signal comprises an input voltage and reference voltage signal.

16. The method of claim 15, wherein the input voltage and reference voltage signals are respectively applied to input transistors of said differential amplifier stage.

17. The method of claim 16, wherein additional transistors respectively couple said differential amplifier stage and said regenerative feedback loop stage to voltage sources, wherein said capture pulse is applied to said additional transistors.

18. The method of claim 14, wherein said precharge pulse is applied to precharge internal nodes of said latching sense amplifier circuit.

* * * * *